(12) United States Patent
Lo et al.

(10) Patent No.: US 7,406,147 B2
(45) Date of Patent: Jul. 29, 2008

(54) SHIFT REGISTER

(75) Inventors: Shin-Tai Lo, Miao Li (TW); Ching-Fu Hsu, Feng Yuan (TW); Wen-Tui Liao, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 11/819,458

(22) Filed: Jun. 27, 2007

(65) Prior Publication Data

US 2008/0013670 A1 Jan. 17, 2008

(30) Foreign Application Priority Data

Jun. 30, 2006 (TW) .............................. 95123965 A

(51) Int. Cl.
  *G11C 19/00* (2006.01)
(52) U.S. Cl. .......................................... 377/64; 377/67
(58) Field of Classification Search .................. None
  See application file for complete search history.

(56) References Cited

U.S. PATENT DOCUMENTS

| 5,631,940 | A | * | 5/1997 | Fujikura | ...................... 377/64 |
|---|---|---|---|---|---|
| 5,949,398 | A | * | 9/1999 | Kim | ........................... 345/100 |
| 6,052,426 | A | | 4/2000 | Maurice | |
| 6,064,713 | A | | 5/2000 | Lebrun et al. | |
| 6,556,646 | B1 | * | 4/2003 | Yeo et al. | ....................... 377/54 |
| 6,690,347 | B2 | | 2/2004 | Jeon et al. | |
| 6,845,140 | B2 | | 1/2005 | Moon et al. | |
| 7,038,653 | B2 | * | 5/2006 | Moon | ........................... 345/100 |
| 7,050,036 | B2 | * | 5/2006 | Kim et al. | .................... 345/100 |
| 7,203,264 | B2 | * | 4/2007 | Lo et al. | ........................ 377/64 |
| 7,233,308 | B2 | * | 6/2007 | Park | ........................... 345/100 |
| 7,289,593 | B2 | * | 10/2007 | Tobita et al. | .................. 377/64 |
| 7,289,594 | B2 | * | 10/2007 | Moon | ........................... 377/68 |
| 7,310,402 | B2 | * | 12/2007 | Wei et al. | ....................... 377/64 |
| 7,349,519 | B2 | * | 3/2008 | Jang et al. | ...................... 377/64 |
| 2004/0032926 | A1 | * | 2/2004 | Yu | ............................... 377/64 |

* cited by examiner

*Primary Examiner*—Cassandra Cox
(74) *Attorney, Agent, or Firm*—Muncy, Geissler, Olds & Lowe, PLLC

(57) ABSTRACT

A shift register includes multiple stages connected with each other in succession. The shift register stores the threshold voltage of an amorphous silicon thin-film transistor in a capacitor. During operation, the bias applied to the transistor is adjusted according to the threshold voltage stored in the capacitor.

24 Claims, 9 Drawing Sheets

SHIFT REGISTER

BACKGROUND OF THE INVENTION (a) Field of the Invention

The invention relates to a shift register, particularly to a shift register constructed by amorphous silicon thin-film transistors.

(b) Description of the Related Art

Typically, thin-film transistor liquid crystal displays (TFT-LCDs) are divided into two types, the amorphous silicon TFT LCD (a-Si TFT-LCD) and the polycrystalline silicon TFT LCD (poly-Si TFT-LCD). An amorphous silicon thin-film transistor is often used in an active matrix type LCD due to its low fabrication cost and high production yield; however, some of its electrical characteristics are inferior compared with a polycrystalline silicon thin-film transistor. Thus, an amorphous silicon gate (ASG) technology accompanied by many testified circuit architectures is proposed to combine with the application of the amorphous silicon thin-film transistor, so that the amorphous silicon thin-film transistor may compare favorably with the polycrystalline silicon thin-film transistor when they are used in a high-resolution display.

FIG. 1A shows a block diagram illustrating a shift register 10 provided in a conventional gate drive circuit that is constructed by amorphous silicon thin-film transistors. Referring to FIG. 1A, the shift register 10 includes 193 unit stages $11_1$-$11_{193}$ for respectively driving 192 scan lines, where a unit stages $11_{193}$ is a dummy unit stage and not connected with any scan line. Each unit stage includes an input terminal IN', an output terminal OUT', a feedback control terminal CT', a clock signal input terminal CK', a first power voltage terminal VSS' and a second power voltage terminal VDD'.

In the shift register 10, an output signal $OUT_{M-1}$ (M is a positive integer; $1<M\leq 193$) of a preceding unit stage $11_{M-1}$ serves as the input signal IN of a succeeding unit stage $11_M$, and an output signal $OUT_M$ of the succeeding unit stage $11_M$ in turn serves as the feedback control signal CT for the preceding unit stage $11_{M-1}$. Thus, the unit stages 11 may drive their respective scan lines in succession.

FIG. 1B shows a detailed circuit diagram of one unit stage 11 shown in FIG. 1A. The unit stage 11 includes a pull-up unit 111, a pull-up drive unit 112, a pull-down unit 113, a pull-down drive unit 114, a floating preventing unit 115, and a turn-on preventing unit 116. Note that all the transistors in the unit stage 11 are amorphous silicon thin-film transistors.

The pull-up unit 111 includes an NMOS transistor Q1. The drain of the NMOS transistor Q1 is connected to the clock signal input terminal CK' for receiving a clock signal CK/CKB, its gate is connected to a first node N1, and its source is connected to the output terminal OUT' for outputting an output signal OUT. The pull-up drive unit 112 includes a capacitor C and three NMOS transistors Q3, Q4 and Q5. The two ends of the capacitor C are respectively connected to the first node N1 and the output terminal OUT'. The drain and the gate of the transistor Q3 are connected with each other; also, its gate is connected to the input terminal IN' for receiving the input signal IN, and its source is connected to the first node N1. The drain of the transistor Q4 is connected to the first node N1, its gate is connected to a second node N2, and its source is connected to the first power voltage terminal VSS' for receiving a first power voltage VSS of a first power voltage source. The first power voltage VSS may have a low voltage level or a ground level. The drain of the transistor Q5 is connected to the first node N1, its gate is connected to the feedback control terminal CT' for receiving the feedback control signal CT, and its source is connected to the first power voltage terminal VSS'. The pull-down unit 113 includes a NMOS transistor Q2 whose drain is connected to the output terminal OUT', gate is connected to the second node N2, and source is connected to the first power voltage terminal VSS'. The pull-down drive unit 114 includes two NMOS transistors Q6 and Q7. The drain of the transistor Q6 is connected to the second power voltage terminal VDD', its gate is connected to the feedback control terminal CT', and its source is connected to the second node N2. The drain of the transistor Q7 is connected to the second node N2, its gate is connected to the input terminal IN', and its source is connected to the first power voltage terminal VSS'. The floating preventing unit 115 includes an NMOS transistor Q8 whose drain and gate are connected with each other to form a diode architecture. Further, the drain of the NMOS transistor Q8 is connected to the second power voltage terminal VDD', and its source is connected to the second node N2. The turn-on preventing unit 116 includes an NMOS transistor Q9 whose drain is connected to the second node N2, gate is connected to the output terminal OUT', and source is connected to the first power voltage terminal VSS'.

The operations of a conventional shift register are described below with reference to FIGS. 1A and 1B, with a third unit stage 113 being taken as an example.

During operation, the shift register $11_3$ receives an output signal $Out_2$ (input signal IN) of a preceding unit stage $11_2$ via the input terminal IN' and receives a clock signal CK via the clock signal input terminal CK' to enable the output signal $Out_3$ of the unit stage $11_3$ to have a high level. Then, the output signal $Out_3$ of the unit stage $11_3$ is disabled to have a low level according to the output signal $Out_4$ (feedback control signal CT) of a succeeding unit stage $11_4$ transmitted via the feedback control terminal CT'. During the scanning process of the shift register 10, each the output signals $Out_1$-$Out_{192}$ in turn is enabled and then disabled; in other words, once the output signal $Out_3$ of the unit stage $11_3$ is enabled, the unit stage $11_3$ will not proceed the next action until the remaining unit stages $11_1$-$11_2$ and unit stage $11_4$-$11_{193}$ all finish proceeding their respective current actions. Thus, the NMOS transistors Q2 and Q4 in each unit stage 11 must be turned on for a long time to keep the output signal OUT disabled. Further, the positively biased NMOS transistors Q2 and Q4 may become zero-biased only as an input signal having a high level is received and the output signal OUT is enabled. Therefore, since the NMOS transistors Q2 and Q4 are always positively biased for a long time, they are liable to malfunction to result in a considerable shift in the threshold voltage Vth of a transistor.

More specifically, during the long-term operation of the unit stage 11, the threshold voltage Vth2 of the NMOS transistor Q2 is continually increased to cause an increase in the on-resistance between the output terminal OUT' and the first power voltage terminal VSS'. In that case, a low dynamic response speed of the output signal OUT is achieved when the voltage of the output signal OUT is changed from the second power voltage VDD to the first power voltage VSS, and the output signal OUT often influenced by surrounding signals or noises to thus hardly maintain its voltage at the first power voltage VSS. This may cause the gate drive circuit to transmit distorted scan signals to result in drive errors. Also, the threshold voltage Vth4 of the NMOS transistor Q4 is continually increased to cause an increase in the on-resistance between the first node N1 and the first power voltage terminal VSS'. In that case, a low dynamic response speed at the first node N1 is achieved when the voltage of the first node N1 is changed from the second power voltage VDD to the first power voltage VSS, and the output signal OUT often influenced by surrounding signals or noises to thus hardly maintain its voltage at the first power voltage VSS. For example, when the clock signal CK is in a high level period, it may erroneously turn on the NMOS transistor Q1 to enable the output signal OUT in case the voltage of the first node N1 is deviated from normal one due to the influence of noises. Under the circumstance, the gate drive circuit may transmit distorted scan signals to result in drive errors that worsen the display quality of a display panel.

FIG. 2 shows a block diagram illustrating a unit stage 21 of another conventional shift register. Referring to FIG. 2, the unit stage 21 includes eight amorphous silicon NMOS transistors M1, M2$a$, M2$b$, M3, M4, M5, M6 and M7. The pull down unit 211 is divided into a first pull-down transistor M2$a$ and a second pull-down transistor M2$b$, and the gate of the transistor M2$b$. Hence, though the second NMOS transistor M2$b$, similar to the NMOS transistor Q2 or Q4 shown in FIG. 1B, is positively biased for a long time to result in a considerable shift in the threshold voltage, the provision of the first pull-down transistor M2$a$ whose gate is controlled by the output signal OUT$_{i+1}$ (i is a positive integer) of a succeeding unit stage 21 may cure this problem. More specifically, when the voltage of the output signal OUT$_i$ is changed from the second power voltage VDD to the first power voltage VSS, the first NMOS transistor M2$a$ may cooperate with the second NMOS transistor M2$b$ to pull down the voltage of an output node to improve the dynamic response speed.

However, the first NMOS transistor M2$a$ may relieve the shift in the threshold voltage only at the moment the output signal OUT$_i$ is pulled down, but, at the remaining moments, the shift in the threshold voltage of the NMOS transistor M2$b$ still influences the operation of the unit stage 21 to result in drive errors.

BRIEF SUMMARY OF THE INVENTION

Hence, an object of the invention is to provide a shift register capable of eliminating the shift in the threshold voltage of a transistor.

According to the invention, a shift register includes N (N is a positive integer) number of unit stages. A first unit stage receives a threshold signal as a drive signal via an input terminal for generating a first output signal. A Q$_{th}$ (Q is a positive integer; 1<Q≦N) unit stage receives a (Q−1)$_{th}$ output signal for generating a Q$_{th}$ output signal. Each odd-numbered unit stage receives an odd-numbered clock signal, a first odd-numbered control signal, a second odd-numbered control signal and a third odd-numbered control signal as drive signals. Each even-numbered unit stage receives an even-numbered clock signal, a first even-numbered control signal, a second even-numbered control signal and a third even-numbered control signal as drive signals. Each unit stage includes a pull-up unit, a pull-up drive unit, a first pull-down unit, a second pull-down unit, a pull-down memory control unit, a floating preventing unit, and a turn-on preventing unit. The pull-up unit includes a first node for receiving the odd-numbered clock signal or the even-numbered clock signal. The pull-up drive unit is connected to the first node for driving the pull-up unit according to the threshold signal or the output signal of a preceding unit stage so as to supply the odd-numbered clock signal or the even-numbered clock signal to an output terminal to generate the output signal. The first pull-down unit includes a first transistor, the drain of the first transistor being connected to the output terminal, its source being connected to a first power voltage source having a first power voltage, and its gate being connected to a second node. The second pull-down unit includes a second transistor, the drain of the second transistor being connected to the first node, its gate being connected to second node, and its source being connected to the first power voltage source. The pull-down memory control unit includes a capacitor whose two ends are respectively connected to the second node and a third node. The pull-down memory control unit receives a first odd-numbered control signal or a first even-numbered control signal to increase the voltage of the second node to a second power voltage so as to turn on the first and the second transistors and to decrease the voltage of the third node to the first power voltage. Also, the pull-down memory control unit receives a second odd-numbered control signal or a second even-numbered control signal to keep the voltage in third node at the first power voltage, and the capacitor maintains a voltage difference between the second node and the third node. The first transistor supplies the first power voltage to the output terminal when the first transistor is in the on-state, the second transistor supplies the first power voltage to the first node when the second transistor is in the on-state, and the pull-up drive unit turns off the pull-up unit according to the first power voltage of the first node.

Through the design of the invention, when the threshold voltage of the first or the second transistor is increased, the voltage of the second node is also increased with the same increment so as to maintain low on-resistances of the first and second transistors and improve the response speed of a switch between the first power voltage and the second power voltage. Accordingly, the bias voltage of the transistors in the unit stage can be dynamically adjusted to avoid harmful fluctuations in the threshold voltage, thus improving the stability of a shift register and extending the lifespan of a display panel.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 3A:
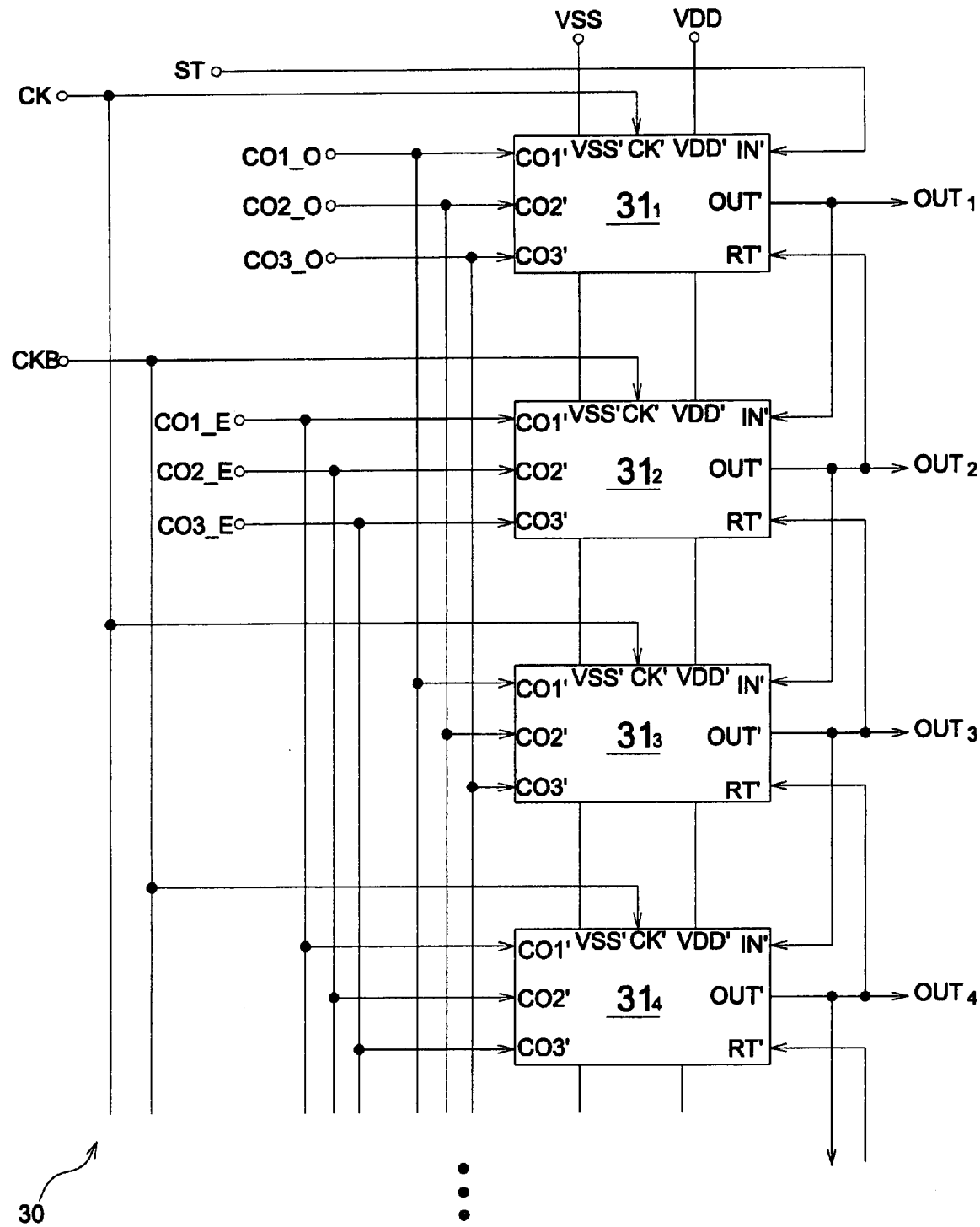
FIG. 3A shows a schematic diagram illustrating a shift register according to an embodiment of the invention.

FIG. 3A shows a schematic diagram illustrating a shift register 30 according to an embodiment of the invention. The shift register 30 is provided in a gate drive circuit constructed by amorphous silicon thin film transistors (a-Si TFTs).

The shift register 30 includes N (N is a positive integer) number of unit stages $31_1$-$31_N$. Each unit stage 31 includes an input terminal IN', an output terminal OUT', a feedback control terminal RT', a clock signal input terminal CK', a first control signal input terminal CO1', a second control signal input terminal CO2', a third control signal input terminal CO3', a first power voltage terminal VSS', and a second power voltage terminal VDD'. The unit stages $31_1$-$31_N$ are connected with one another in succession. The input terminal IN' of a first unit stage $31_1$ receives a threshold signal St as an input signal IN for driving the unit stage $31_1$ to generate a first output signal $OUT_1$. The input terminal IN' of the $Q_{th}$ (Q is a positive integer; $1<Q\leq N$) unit stage $31_Q$ receives an output signal $OUT_{Q-1}$ as an input signal for driving the unit stage $31_Q$ to generate an output signal $OUT_Q$. The $Q_{th}$ unit stage $31_Q$ uses an output signal $OUT_{Q+1}$ of a (Q+1)th unit stage $31_{Q+1}$ as a feedback control signal RT and disables the output signal $OUT_Q$ of the Qth unit stage $31_Q$ to a low level according to the feedback control signal RT. For example, a second unit stage $31_2$ receives an output signal $OUT_1$ of the first unit stage $31_1$ and uses the output signal $OUT_1$ as an input signal IN to generate a second output signal $OUT_2$; also, the second unit stage $31_2$ uses an output signal $OUT_3$ of the unit stage $31_3$ as a feedback control signal RT and disables the output signal $OUT_2$ of the second unit stage $31_2$ to a low level according to the feedback control signal RT. Further, each odd-numbered unit stage 31 receives an odd-numbered clock signal CK, a first odd-numbered control signal CO1_O, a second odd-numbered control signal CO2_O, and a third odd-numbered control signal CO3_O as drive signals; in comparison, each even-numbered unit stage 31 receives an even-numbered clock signal CKB, a first even-numbered control signal CO1_E, a second even-numbered control signal CO2_E, and a third even-numbered control signal CO3_E as drive signals.

Figure 3B:
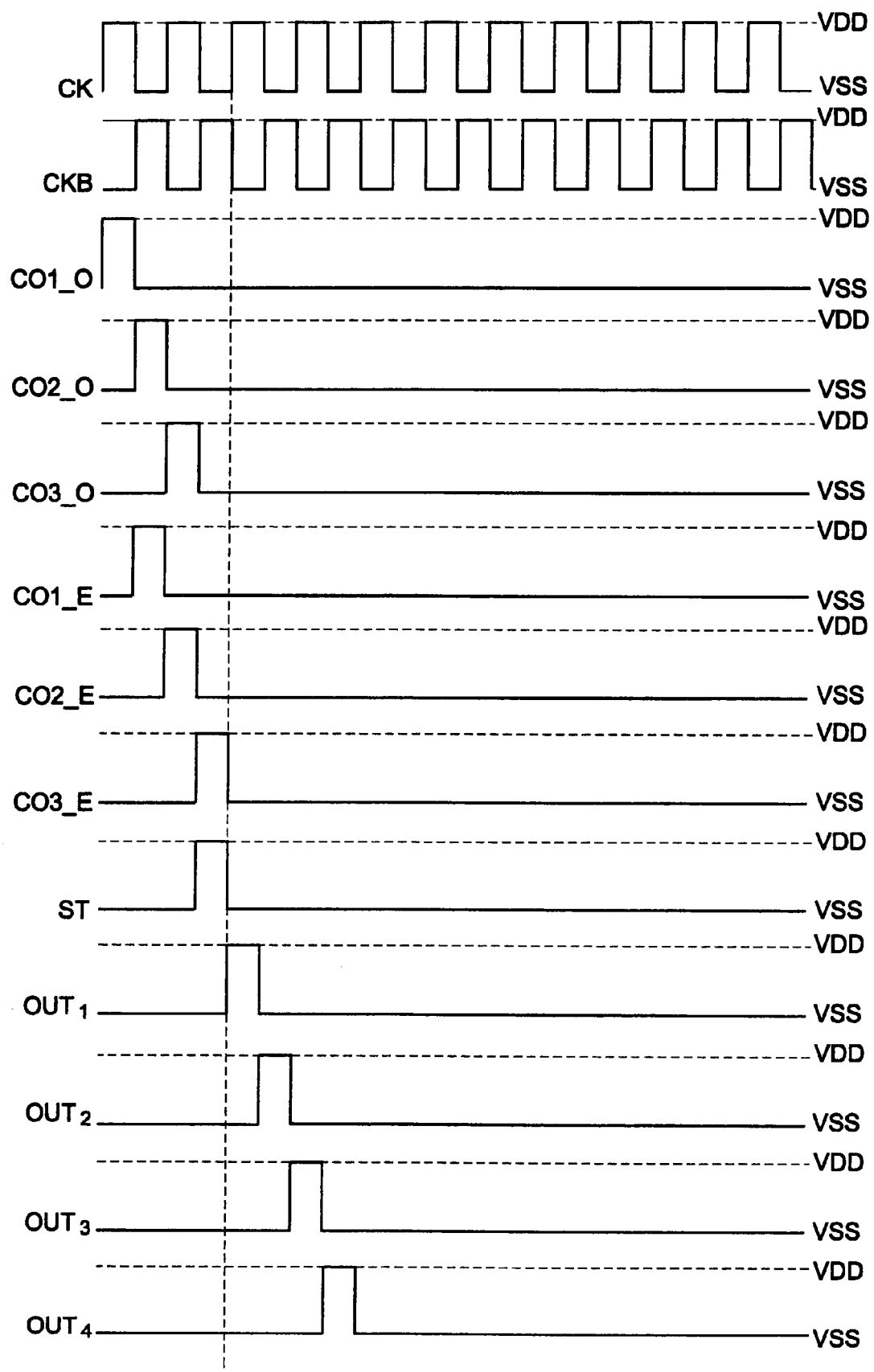
FIG. 3B shows waveform diagrams of input signals and output signals according to an embodiment of the invention.

FIG. 3B shows waveform diagrams of input signals CK, CKB, CO1_O, CO2_O, CO3_O, CO1_E, CO2_E, CO3_E and ST and output signals $OUT_1$-$OUT_4$.

As shown in these waveform diagrams, the odd-numbered clock signal CK has a phase opposite to that of the even-numbered clock signal CKB, and the first odd-numbered control signal CO1_O and the first even-numbered control signal CO1_E have a phase difference of one duty period. Further, the second odd-numbered control signal CO2_O and the second even-numbered control signal CO2_E have a phase difference of one duty period, and the third odd-numbered control signal CO3_O and third even-numbered control signal CO3_E also have a phase difference of one duty period. Besides, the first odd-numbered control signal CO1_O and the second odd-numbered control signal CO2_O have a phase difference of one duty period, and the second odd-numbered control signal CO2_O and the third odd-numbered control signal CO3_O also have a phase difference of one duty period. In other words, each two consecutive odd-numbered control signals have a phase difference of one duty period. Similarly, as shown in FIG. 3B, each two consecutive even-numbered control signals have a phase difference of one duty period.

Referring to FIG. 3A again, when the threshold signal ST is in a high level period, the unit stages $31_1$-$31_N$ of the shift register 30 begin to respectively output the signals $OUT_1$-$OUT_N$ that are enabled and disabled in succession to drive each scan line.

Figure 3C:
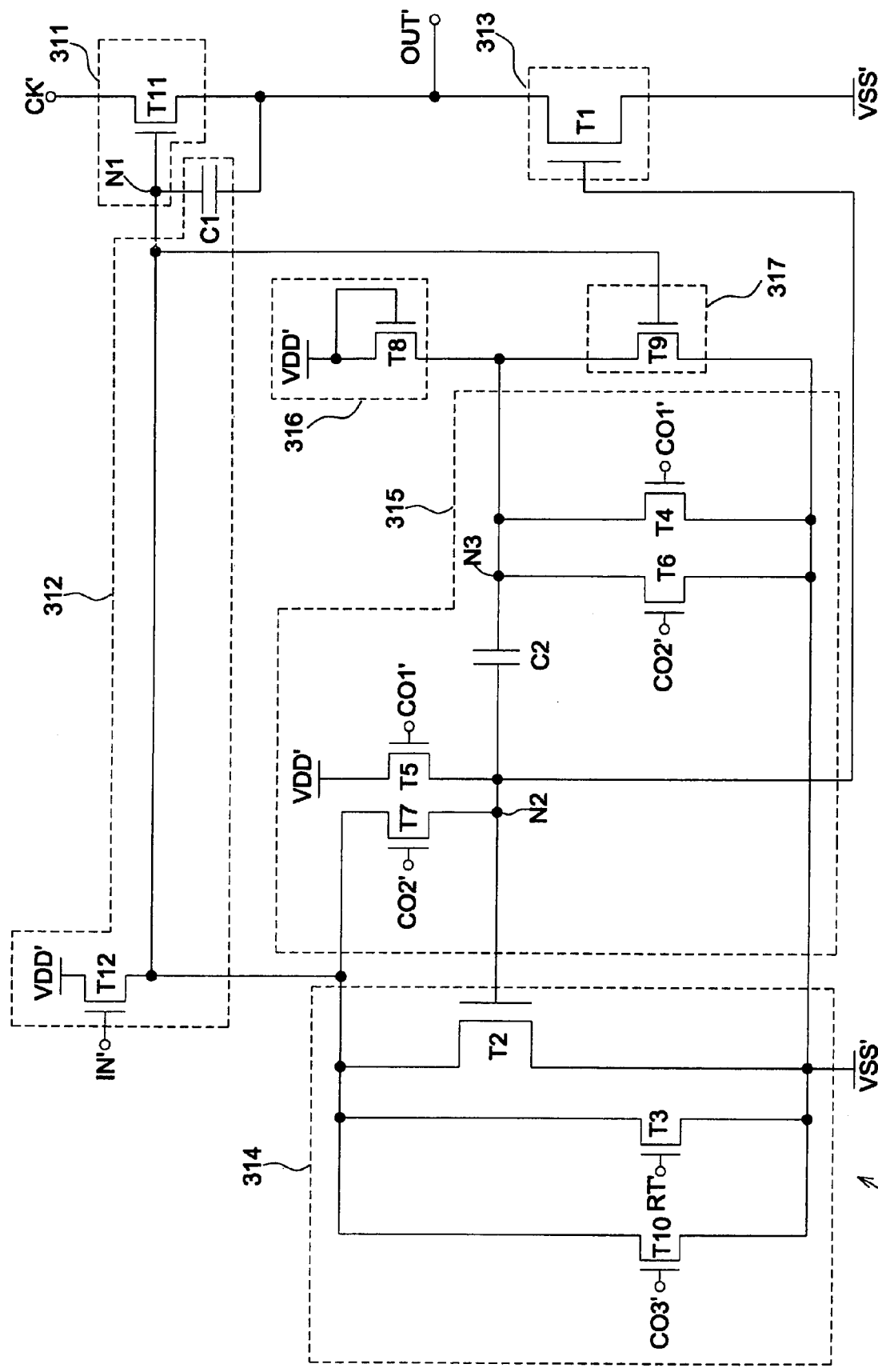
FIG. 3C shows a detailed circuit diagram of a unit stage in the shift register according to an embodiment of the invention.

FIG. 3C shows a detailed circuit diagram of a unit stage 31 in the shift register 30. The unit stage 31 includes a pull-up unit 311, a pull-up drive unit 312, a first pull-down unit 313, a second pull-down unit 314, a pull-down memory control unit 315, a floating preventing unit 316, and a turn-on preventing unit 317. Note that all the transistors in each unit stage 31 are a-Si TFTs.

The pull-up unit 311, which includes a first node N1 and an eleventh transistor T11, receives an odd-numbered clock signal CK or an even-numbered clock signal CKB. The drain of the eleventh transistor T11 is connected to the clock signal input terminal CK' to receive the odd-numbered clock signal CK or the even-numbered clock signals CKB, its gate is connected to the first node N1, and its source is connected to the output terminal OUT'.

The pull-up drive unit 312 is connected to the first node N1 and receives a threshold signal ST or an output signal $OUT_{i-1}$ of a preceding unit stage 31 as an input signal IN via the input terminal IN' to drive the pull-up unit 311, so that the odd-numbered clock signal CK or the even-numbered clock signal CKB is transmitted to the output terminal OUT' to generate an output signal $OUT_i$. The pull-up drive unit 312 includes a twelfth transistor T12 and a first capacitor C1. The drain of the twelfth transistor T12 is connected to a second power voltage terminal VDD' to receive a high-level second power voltage VDD of a second power voltage source, its gate receives the threshold signal ST or the output signal $OUT_{i-1}$ of a preceding unit stage 31, and its source is connected to the first node N1. The first capacitor C1 has one end connected to the first node N1 and an opposed end connected to the output terminal OUT'.

The first pull-down unit 313 determines whether to pull down the voltage of the output signal OUT to a first power voltage VSS according to the voltage level of the second node N2. The first pull-down unit 313 is supplied with the first power voltage VSS of a first power voltage source via a first power voltage terminal VSS', and the first power voltage VSS may have a ground level or a low voltage level. The first pull-down unit 313 includes a first transistor T1. The drain of the first transistor T1 is connected to the output terminal OUT', its source is connected to the first power voltage terminal VSS', and its gate is connected to the second node N2.

The second pull-down unit 314 that is connected to the first power voltage terminal VSS' determines whether to pull down the voltage of the first node N1 to the first power voltage VSS according to the voltage level of the second node N2, the feedback control signal RT, or the third odd-numbered control signal CO3_O (third even-numbered control signal CO3_E). The second pull-down unit 314 includes a second transistor T2, a third transistor T3, and a tenth transistor T10. The drain of the second transistor T2 is connected to the first node N1, its gate is connected to the second node N2, and its source is connected to the first power voltage terminal VSS'. The drain of the third transistor T3 is connected to the first node N1, its gate receives the output signal $OUT_{i+1}$ of a back unit stage 31, and its source is connected to the first power voltage terminal VSS'. The drain of the tenth transistor T10 is connected to the first node N1, its gate is connected to the third control signal input terminal CO3' for receiving a third odd-numbered control signal CO3_O or a third even-numbered control signal CO3_E, and its source is connected to the first power voltage terminal VSS'.

The pull-down memory control unit 315 includes a second capacitor C2, a fourth transistor T4, a fifth transistor T5, a sixth transistor T6, and a seventh transistor T7. The pull-down memory control unit 315 receives a first odd-numbered signal CO1_O or a first even-numbered control signal CO1_E and, according to these signals, pulls up the voltage of the second node N2 to the second power voltage VDD and pulls down the voltage of the third node N3 to the first power voltage VSS so as to turn on the first and second transistors T1 and T2 in the pull-down units 313 and 314.

Further, the pull-down memory control unit 315 receives a second odd-numbered signal CO2_O or a second even-numbered control signal CO2_E. According to these signals, the pull-down memory control unit 315 connects the drain with the gate of the second transistor T2, keeps the voltage of the third node N3 at the first power voltage VSS, and uses the second capacitor C2 to maintain the voltage difference between the first threshold voltage Vth1 of the first transistor T1 and the second threshold voltage Vth2 of the second transistor T2 (i.e., the voltage difference between the second node N2 and the third node N3). The second capacitor C2 of the pull-down memory control unit 315 has one end connected to the second node N2 and an opposed end connected to the third node N3. The drain of the fourth transistor T4 is connected to the third node N3, its gate is connected to the first control signal input terminal CO1' for receiving the first odd-numbered signal CO1_O or first even-numbered control signal CO1_E, and its source is connected to the first power voltage terminal VSS'. The drain of the fifth transistor T5 is connected to the second power voltage terminal VDD', its gate is connected to the first control signal input terminal CO1' for receiving first odd-numbered signal CO1_O or first even-numbered control signal CO1_E, and its source is connected to the second node N2. The drain of the sixth transistor T6 is connected to the third node N3, its gate is connected to the second control signal input terminal CO2' for receiving the second odd-numbered signal CO2_O or second even-numbered control signal CO2_E, and its source is connected to the first power voltage terminal VSS. The drain of the seventh transistor T7 is connected to the first node N1, its gate is connected to the second control signal input terminal CO2' for receiving the second odd-numbered control signal CO2_O or second even-numbered control signal CO2_E, and its source is connected to the second node N2.

The floating preventing unit 316 is connected to the third node N3 for supplying the second power voltage VDD to the third node N3 and for preventing the third node N3 from being floated. Also, the floating preventing unit 316 includes an eighth transistor T8. The gate and drain of the eighth transistor T8 are connected with each other to form a diode architecture, its drain is connected to the second power voltage terminal VDD', and its source is connected to the third node N3.

The turn-on preventing unit 317 that is connected to the third node N3 determines whether to supply the first power voltage VSS to the third node N3 according to the voltage level of the first node N1. The turn-on preventing unit 317 includes a ninth transistor T9 whose drain is connected to the third node N3, gate is connected to the first node N1, and source is connected to the first power voltage terminal VSS'.

During operation, when the third transistor T3 of the second pull-down unit 314 is turned on by the output signal $OUT_{j+1}$ of a succeeding unit stage 31, the third transistor T3 supplies the first power voltage VSS to the first node N1. Further, when the tenth transistor T10 of the second pull-down unit 314 is turned on by the third odd-numbered control signal CO3_O or third even-numbered control signal CO3_E, the tenth transistor T10 supplies first power voltage VSS to the first node N1. Also, when the first transistor T1 of the first pull-down unit 313 is turned on by the pull-down memory control unit 315, the first transistor T1 supplies first power voltage VSS to the output terminal OUT'. Besides, when the second transistor T2 of the second pull-down unit 314 is turned on by the pull-down memory control unit 315, the second transistor T2 supplies the first power voltage VSS to the first node N1. From the above conditions, the pull-up drive unit 312 turns off the eleventh transistor T11 in the pull-up unit 311 according to the first power voltage VSS of the first node N1.

Note that the aspect ratios W/L of the fourth, sixth and ninth transistors T4, T6 and T9 are set to be larger than and in proportion to that of the eighth transistor T8. For example, the aspect ratio W/L of the fourth transistor T4 is ten times than that of the eighth transistor T8. The width W and length L of each transistor are listed below:

| T1  | W = 1000 um | L = 5 um |
|-----|-------------|----------|
| T2  | W = 1000 um | L = 5 um |
| T3  | W = 100 um  | L = 5 um |
| T4  | W = 1000 um | L = 5 um |
| T5  | W = 100 um  | L = 5 um |
| T6  | W = 1000 um | L = 5 um |
| T7  | W = 100 um  | L = 5 um |
| T8  | W = 100 um  | L = 5 um |
| T9  | W = 1000 um | L = 5 um |
| T10 | W = 100 um  | L = 5 um |
| T11 | W = 2000 um | L = 5 um |
| T12 | W = 500 um  | L = 5 um |

As shown in the above table, the aspect ratio W/L of the fourth, sixth, and ninth transistors T4, T6 and T9 equals 200, and the aspect ratio W/L of the eighth transistor equals 20. Certainly, the above values are listed as examples and they can be arbitrarily modified according to the actual demand.

Figure 3D:
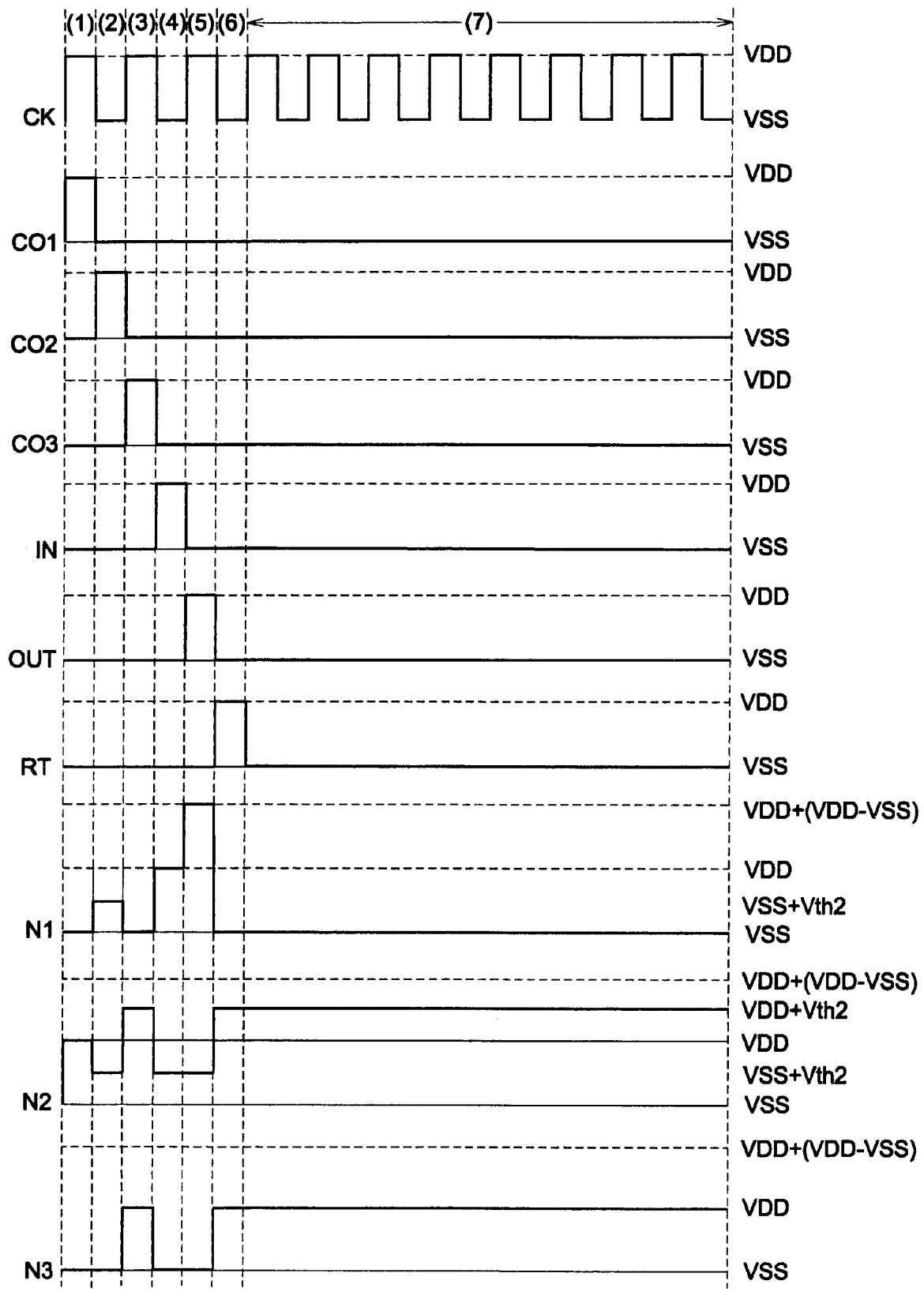
FIG. 3D shows waveform diagrams illustrating the voltage level variation of input signals, output signals and characteristic nodes in the unit stage during operation.

FIG. 3D shows waveform diagrams illustrating the voltage level variation of input signals, output signals and characteristic nodes in the unit stage during operation.

Please refer to both FIGS. 3C and 3D. The operations of a unit stage according to the invention can be divided into seven stages as described below.

1. First Stage (CK=H, CO1=H, CO2=L, CO3=L, IN=L, OUT=L, RT=L; where symbol "H" indicates a high level period and "L" indicates a low level period)

When the first control signal CO1 is in a high level period, the fourth and fifth transistors T4 and T5 of the pull-down memory control unit 315 are in the on-state. Note that the aspect ratio W/L of the fourth transistor T4 is set as lager than and in proportion to that of the eighth transistor T8 in the floating preventing unit 316; hence, though the eighth transistor T8 is turned on due to its diode architecture, the voltage of the third node N3 I s the first power voltage VSS since the fourth transistor T4 has a comparably low on-resistance. Meanwhile, the fifth transistor T5 in the on-state causes the voltage of the second node N2 to equal the second power voltage VDD, so that a voltage difference maintained by the second capacitor C2 (i.e., voltage difference between the second node N2 and the third node N3) equals the second power voltage VDD minus the first power voltage VSS.

Further, since the voltage of the second node N2 is changed to the second power voltage VDD, the second transistor T2 in the second pull-down unit 314 and the first transistor T1 in the first pull-down unit 313 are turned on to allow the voltages of the first node N1 and the output signal OUT to keep at the first power voltage VSS.

2. Second Stage (CK=L, CO1=L, CO2=H, CO3=L, IN=L, OUT=L, RT=L)

When the second control signal CO2 is in a high level period, the sixth and seventh transistors T6 and T7 in the pull-down memory control unit 315 are in the on-state. Note that the aspect ratio W/L of the sixth transistor T6 is set as lager than and in proportion to that of the eighth transistor T8 in the floating preventing unit 316; hence, though the eighth transistor T8 is turned on due to its diode architecture, the voltage of the third node N3 keeps at the first power voltage VSS since the sixth transistor T6 has a comparably low on-resistance. Meanwhile, the seventh transistor T7 in the on-state causes the drain and the gate of the second transistor T2 in the second pull-down unit 314 to be connected with each other to form a diode architecture. Thus, the second capacitor C2 is discharged via the second transistor T2, and the voltage of the second node N2 is gradually decreased from the second power voltage VDD to the first power voltage VSS plus the threshold voltage of the second transistor T2 (VSS+Vth2).

Further, since the voltage of the third node N3 keeps at the first power voltage VSS, the voltage difference maintained by the second capacitor C2 (i.e., voltage difference between the second node N2 and the third node N3) is changed to the threshold voltage Vth2. Also, since the first and second transistors T1 and T2 suffer from the same bias condition, the threshold voltage Vth2 maintained by the second capacitor C2 equals the threshold voltage Vth1 of the first transistor T1. Finally, the threshold voltage Vth1 of the first transistor T1 and the threshold voltage Vth2 of the second transistor T2 are both stored in the first capacitor C1. Also, the seventh transistor T7 in the on-state causes a connection between the first node N1 and the second node N2, so that the voltage of the first node N1 is changed from the first power voltage VSS to the first power voltage VSS plus the threshold voltage Vth2 (VSS+Vth2). As for the eleventh transistor T11 in the pull-up unit 311, the voltage of the output signal OUT keeps at the first power voltage Vss since the voltage of the clock signal CK equals the first power voltage VSS.

3. Third Stage
(CK=H, CO1=L, CO2=L, CO3=H, IN=L, OUT=L, RT=L)

When the third control signal CO3 is in a high level period, the tenth transistor T10 in the on-state in the second pull-down unit 314 causes the voltage of the second node N2 to decrease to the first power voltage VSS. Hence, as for the eleventh transistor T11 in the pull-up unit 311, even the voltage of the clock signal CK equals the second power voltage VDD, the voltage of the output signal OUT keeps at the first power voltage VSS since the voltage in the gate of the eleventh transistor T11 equals the first power voltage VSS.

Also, since the voltage of the first node N1 is decreased to the first power voltage VSS, the ninth transistor T9 in the turn-on preventing unit 317 is turned off. Besides, since the eighth transistor T8 in the floating preventing unit 316 is turned on due to its diode architecture, the voltage of the third node N3 is increased from the first power voltage VSS to the second power voltage VDD, and the voltage difference between maintained by the second capacitor C2 equals the threshold voltage Vth2. Thus, the voltage of the second node N2 is increased to the second power voltage VDD plus the threshold voltage Vth2 (VDD+Vth2), and the first transistor T1 and the second transistor T2 are turned on to allow the voltages of the first node N1 and the output signal OUT to both keep at the first power voltage VSS.

4. Fourth Stage
(CK=L, CO1=L, CO2=L, CO3=L, IN=H, OUT=L, RT=L)

When the input signal is in a high level period, the twelfth transistor T12 in the on-state in the pull-up drive unit 312 increases the voltage of the first node N1 so as to turn on the ninth transistor T9 in the turn-on preventing unit 317. Note that the aspect ratio W/L of the ninth transistor T9 is set as lager than and in proportion to that of the eighth transistor T8 in the floating preventing unit 316; hence, though the eighth transistor T8 is turned on due to its diode architecture, the voltage of the third node N3 is changed to the first power voltage VSS since the ninth transistor T9 has a comparably low on-resistance. Further, the voltage difference maintained by the second capacitor C2 (i.e., voltage difference between the second node N2 and the third node N3) equals the threshold voltage Vth2, so the voltage of the second node N2 is decreased to the first power voltage VSS plus the threshold voltage Vth2 (VSS+Vth2) to turn off the first and the second transistors T1 and T2. Besides, the voltage of the first node N1 is increased to the second power voltage VDD to turn on the eleventh transistor T11 in the pull-up unit 311. However, since the voltage of the clock signal CK equals the first power voltage VSS, the voltage of the output signal OUT remains at the first power voltage VSS, and the voltage difference maintained by the first capacitor C1 is changed to the second power voltage VDD minus the first power voltage VSS (VDD−VSS).

5. Fifth Stage
(CK=H, CO1=L, CO2=L, CO3=L, IN=L, OUT=H, RT=L)

At this stage, because the transistors T2, T3, T7, T10 and T12 are in the off-state, the first node N1 is floated and the voltage difference maintained by the first capacitor C1 remains at the second power voltage VDD minus the first power voltage VSS (VDD−VSS). When the voltage of the clock signal CK is changed from the first power voltage VSS to the second power voltage VDD, the continual on-state of the eleventh transistor T11 in the pull-up unit 311 causes the voltage of the output signal OUT to increase from the first power voltage VSS to the second power voltage VDD; meanwhile, since the voltage difference maintained by the first capacitor C1 remains at the second power voltage VDD minus the first power voltage VSS (VDD−VSS), the voltage of the first node N1 is increased to equal two times of the second power voltage VDD minus the first power voltage VSS. Such operation is typically referred to as bootstrapping that causes the eleventh transistor T11 continually turned on.

Then, the ninth transistor T9 in the turn-on preventing unit 317 causes the voltage of the third node N3 to keep at the first power voltage VSS because of the increase of the voltage of the first node N1. Besides, since the voltage difference maintained by the second capacitor C2 equals the threshold voltage Vth2, the voltage of the second node N2 equals the first power voltage VSS plus the threshold voltage Vth2, and thus the first and second transistors T1 and T2 are turned off to allow the voltage of the output signal OUT to remain at the second power voltage VDD.

6. Sixth stage
(CK=L, CO1=L, CO2=L, CO3=L, IN=L, OUT=L, RT=H)

At this stage, when the voltage of the clock signal is changed from the second power voltage VDD to the first power voltage VSS, a succeeding unit stage 31 outputs a signal $OUT_{i+1}$ as a feedback control signal RT for the current unit stage 31. Thus, the voltage of the feedback control signal RT of the current unit stage 31 is changed from the first power voltage VSS to the second power voltage VDD to turn on the third transistor T3 in the second pull-down unit 314. Under the circumstances, the voltage of the first node N1 is decreased to the first power voltage VSS to turn off the ninth transistor T9 in the turn-on preventing unit 317. Meanwhile, the eighth transistor T8 in the floating preventing unit 316 is in the on-state due to its diode architecture and causes the voltage of the third node N3 to change from the first power voltage VSS to the second power voltage VDD. Since the voltage difference maintained by the second capacitor C2 remains at the threshold voltage Vth2, the voltage of the second node N2 are increased to equal the second power voltage VDD plus the threshold voltage Vth2 to turn on the first and the second transistors T1 and T2. Finally, the voltages of the first node N1 and the output signal OUT both equal the first power voltage VSS.

7. Seventh Stage (CK=H, CO1=L, CO2=L, CO3=L, IN=L, OUT=L, RT=L)

At this stage, the eighth transistor T8 in the floating preventing unit 316 is in the on-state due to its diode architecture and causes the voltage of the third node N3 to remain at the second power voltage VDD, and the voltage of the second node N2 remains at the second power voltage plus the threshold voltage Vth2 since the voltage difference maintained by the second capacitor C2 equals the threshold voltage Vth2. Under the circumstance, the first and second transistors T1 and T2 are positively biased to remain in the on-state. Thus, the voltages of the first node N1 and the output signal OUT both remain at the first power voltage VSS.

Figure 1A:
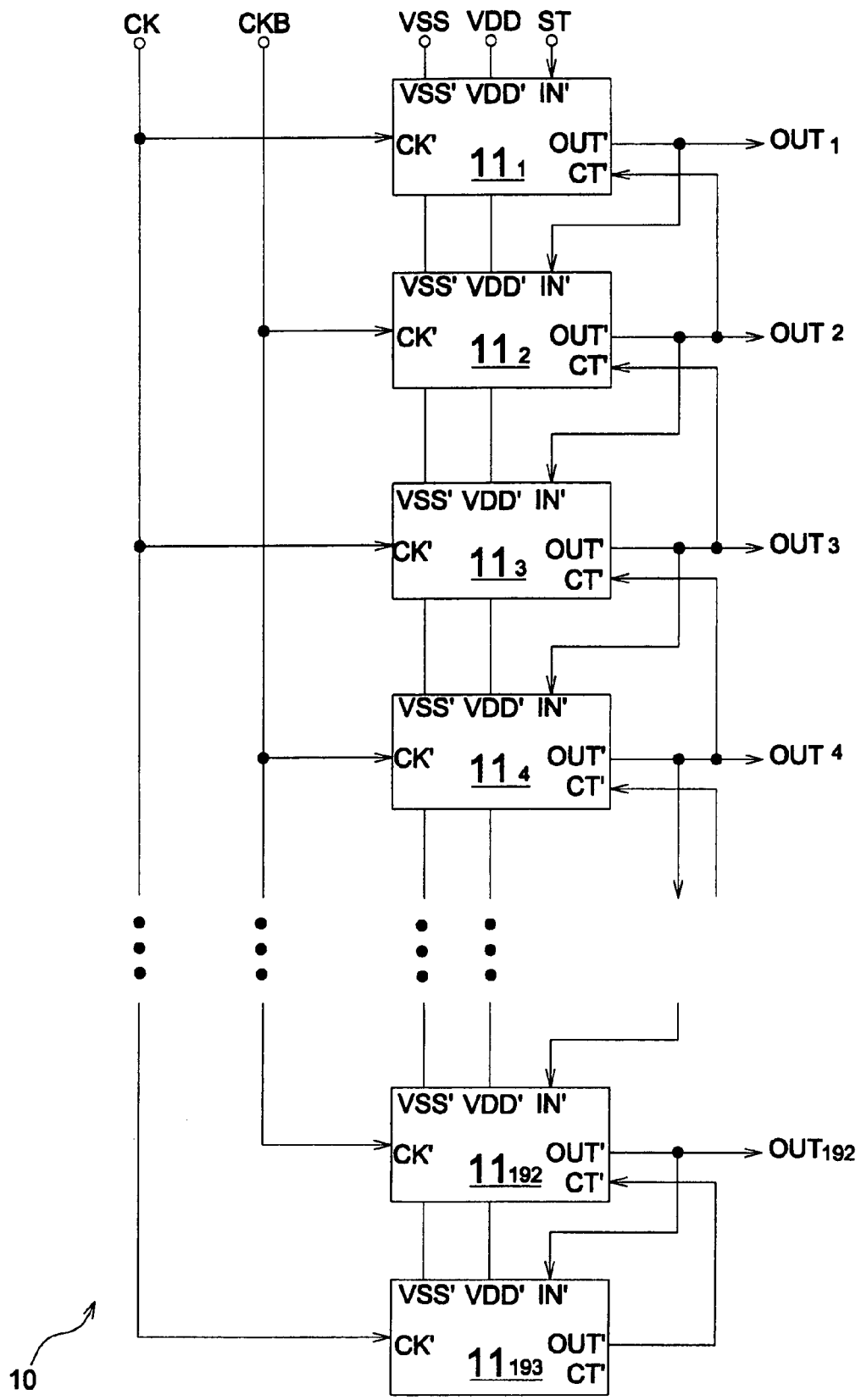
FIG. 1A shows a block diagram illustrating a shift register provided in a conventional gate drive circuit
Figure 1B:
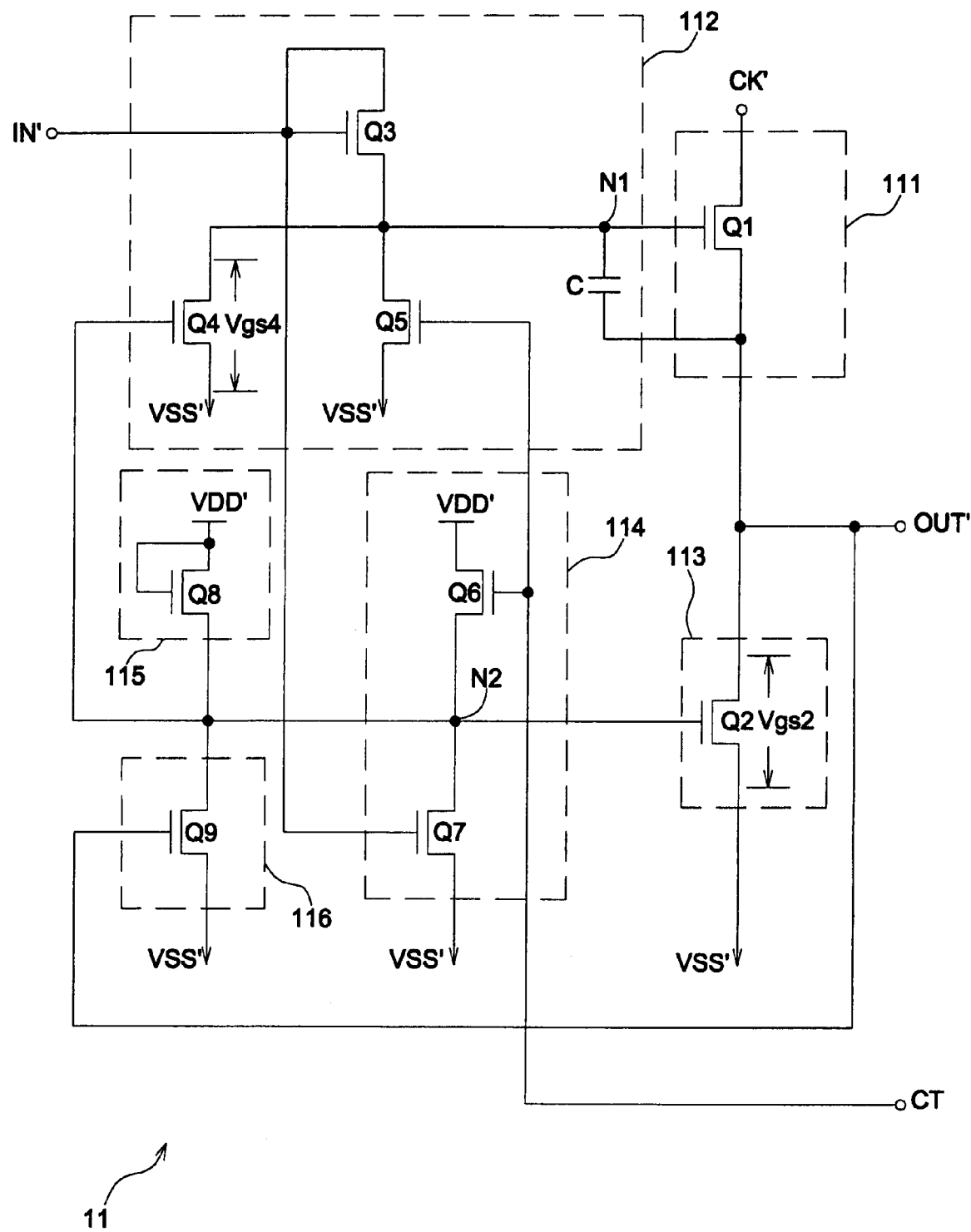
FIG. 1B shows a detailed circuit diagram of one unit stage shown in FIG. 1A.
Figure 2:
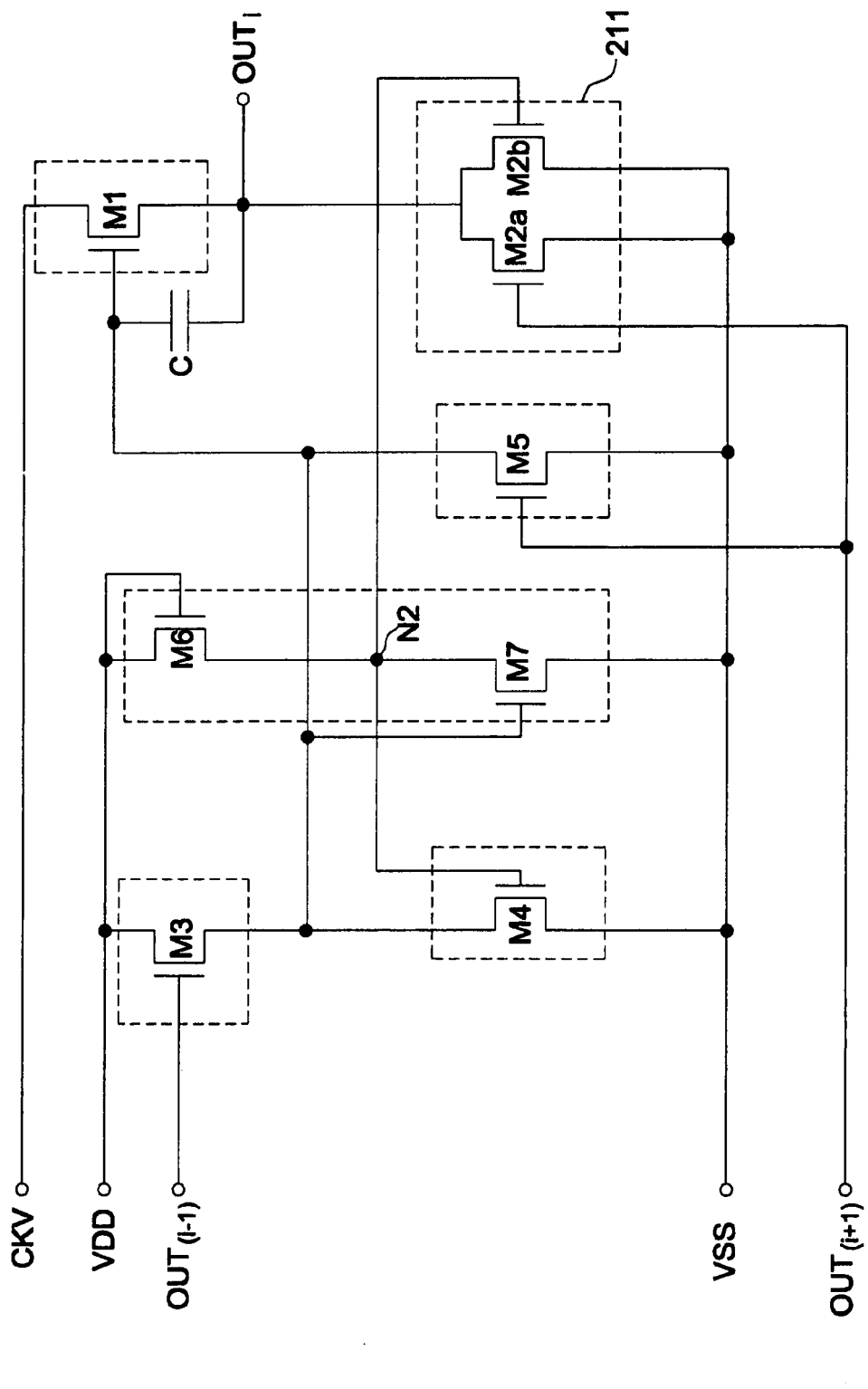
FIG. 2 shows a block diagram illustrating a unit stage of another conventional shift register.

Because the bias condition existing in the seventh stage remains in the unit stage 31 until the unit stage 31 is once again driven, the first and the second transistors T1 and T2, similar to the conventional transistors Q2, Q4 and M2a shown in FIG. 1B and FIG. 2, are positively biased for a long time to probably cause a shift in the threshold voltage Vth. However, according to the invention, in each of the seven stages, the second capacitor C2 in the pull-down memory control unit 315 records the fluctuations in the threshold voltage of the first and the second transistors T1 and T2 to dynamically adjust the bias voltage of the first and the second transistors T1 and T2. More specifically, when the threshold voltage Vth1 (or Vth2) is increased, the voltage of the second node N2 is also increased with the same increment so as to maintain low on-resistances of the first and second transistors T1 and T2 and improve the response speed of a switch between the first power voltage VSS and the second power voltage VDD. Accordingly, the bias voltage of the transistors in the unit stage 31 according to the invention can be dynamically adjusted to avoid harmful fluctuations in the threshold voltage, thus improving the stability of a shift register and extending the lifespan of a display panel.

Figure 4A:
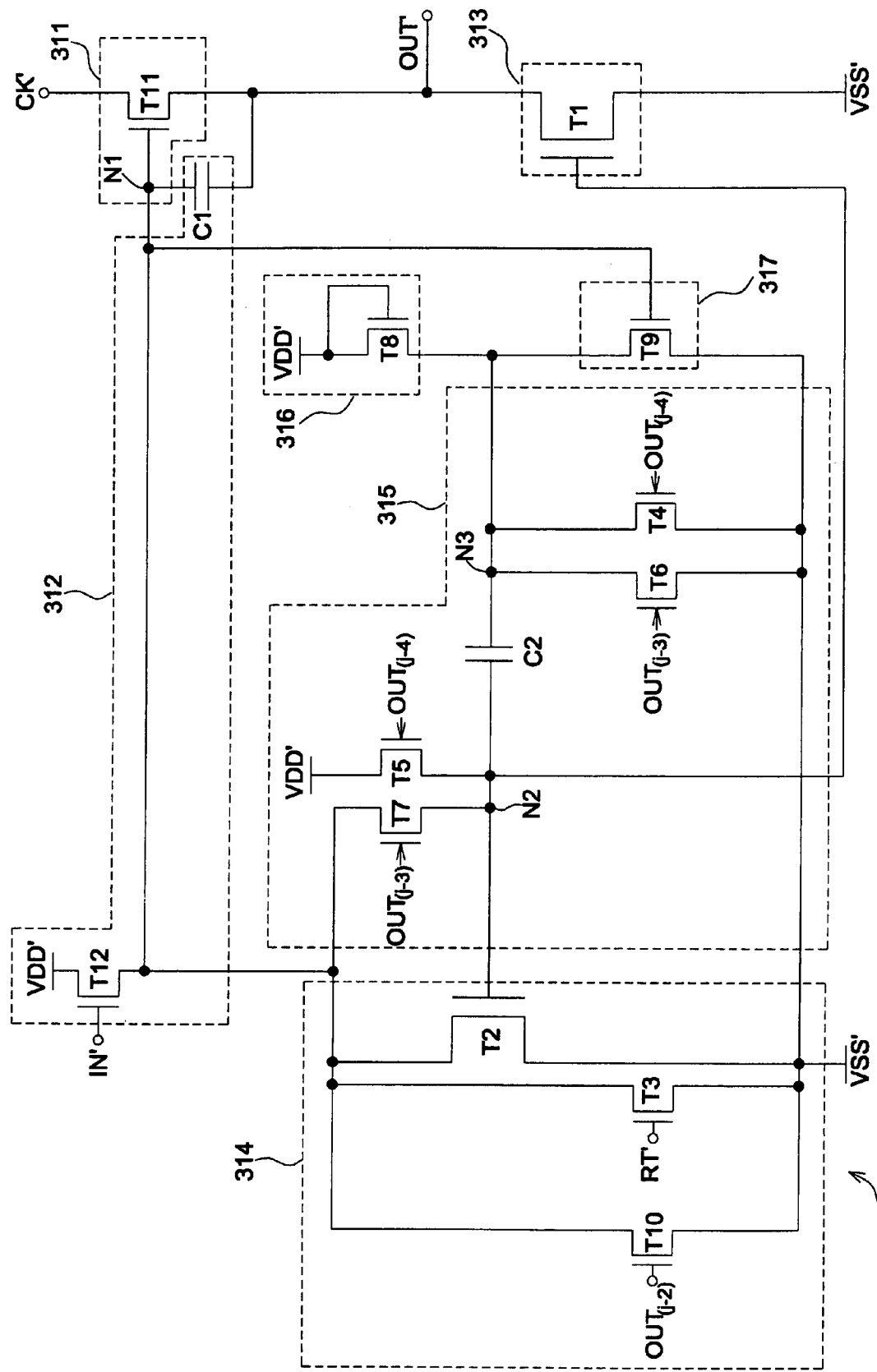
FIG. 4A shows a circuit diagram illustrating another embodiment of the invention.
Figure 4B:
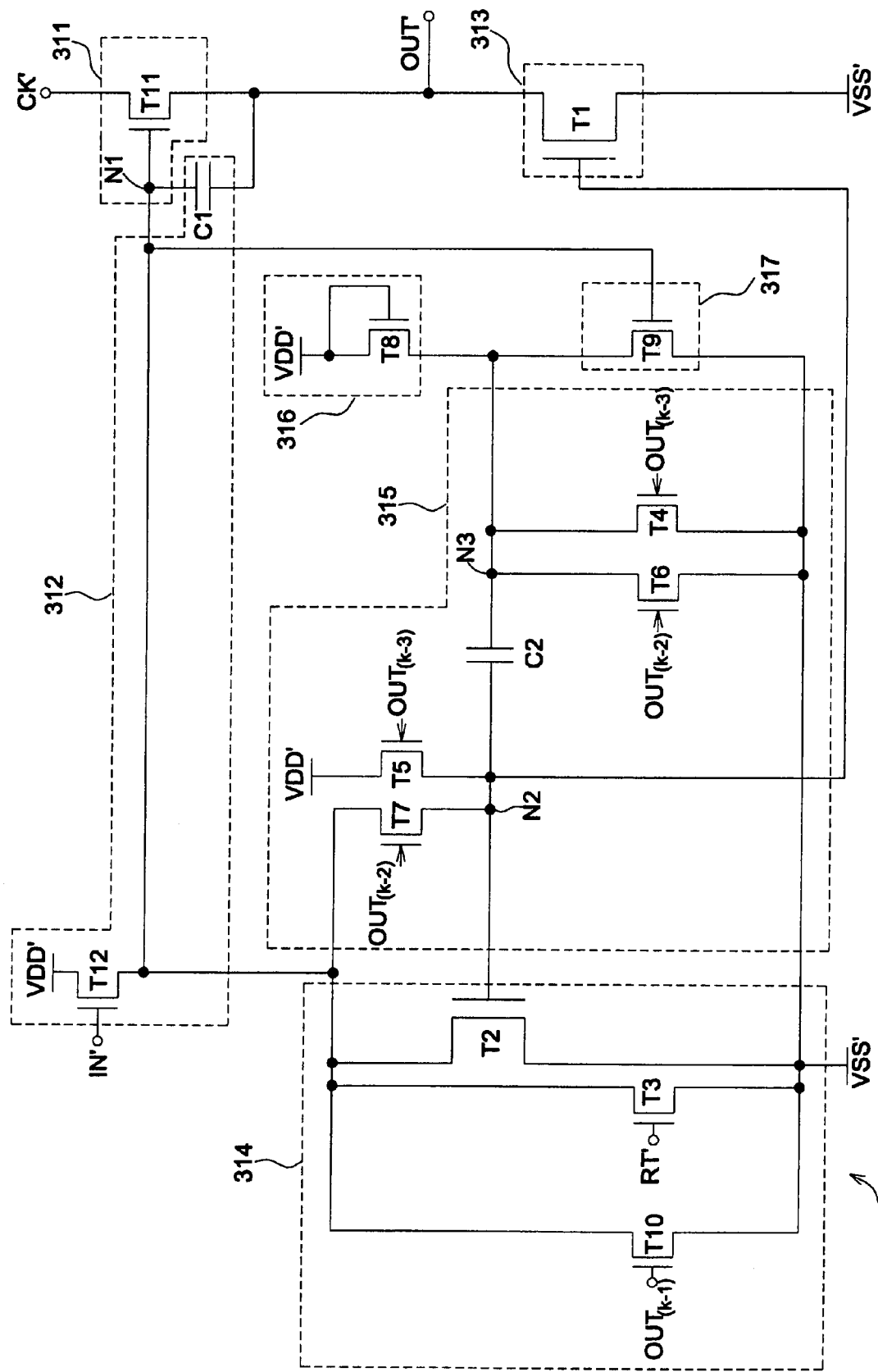
FIG. 4B shows a circuit diagram illustrating another embodiment of the invention.

Further, as shown in FIG. 4A, assume odd-numbered unit stages $31_j$ (j is an odd number; j>4) are provided, the first odd-numbered control signal CO_1, second odd-numbered control signal CO_2, and third odd-numbered control signal CO_3 that are formerly received by an external control device (not shown) may be replaced by an output signal $OUT_{j-4}$ of the unit stage $31_{j-4}$, an output signal $OUT_{j-3}$ of the unit stage $31_{j-3}$, and an output signal $OUT_{j-2}$ of the unit stage $31_{j-2}$, respectively. Also, as shown in FIG. 4B, assume even-numbered unit stages $31_k$ (k is an even number; k>3) are provided, the first even-numbered control signal CO1_E, second even-numbered control signal CO2_E, and third even-numbered control signal CO3_E that are formerly received by an external control device (not shown) may be replaced by an output signal $OUT_{k-3}$ of the unit stage $31_{k-3}$, an output signal $OUT_{k-2}$ of the unit stage $31_{k-2}$, and an output signal $OUT_{k-1}$ of the unit stage $31_{k-1}$, respectively. Hence, the external control device can be omitted to reduce the fabrication cost.

Moreover, though each transistor in the unit stage 31 is exemplified as an NMOS transistor in the above embodiments, this is not limited and the transistor may be a PMOS transistor or other device having similar functions.

While the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A shift register, comprising:
    N number (N is a positive integer) of unit stages each having an input terminal, wherein a first unit stage receives a threshold signal as a drive signal via the input terminal for generating a first output signal, a $Q_{th}$ (Q is a positive integer; 1<Q≦N) unit stage receives a $(Q-1)_{th}$ output signal for generating a $Q_{th}$ output signal, each odd-numbered unit stage receives an odd-numbered clock signal, a first odd-numbered control signal, a second odd-numbered control signal and a third odd-numbered control signal as drive signals, each even-numbered unit stage receives an even-numbered clock signal, a first even-numbered control signal, a second even-numbered control signal and a third even-numbered control signal as drive signals, and wherein each unit stage comprises:
        a pull-up unit comprising a first node for receiving the odd-numbered clock signal or the even-numbered clock signal;
        a pull-up drive unit connected to the first node for driving the pull-up unit according to the threshold signal or the output signal of a preceding unit stage so as to supply the odd-numbered clock signal or the even-numbered clock signal to an output terminal to generate the output signal;
        a first pull-down unit comprising a first transistor, the drain of the first transistor being connected to the output terminal, its source being connected to a first power voltage source having a first power voltage, and its gate being connected to a second node;
        a second pull-down unit comprising a second transistor, the drain of the second transistor being connected to the first node, its gate being connected to second node, and its source being connected to the first power voltage source; and
        a pull-down memory control unit comprising a capacitor whose two ends are respectively connected to the second node and a third node, the pull-down memory control unit receiving a first odd-numbered control signal or a first even-numbered control signal to increase the voltage of the second node to a second power voltage so as to turn on the first and the second transistors and to decrease the voltage of the third node to the first power voltage, and receiving a second odd-numbered control signal or a second even-numbered control signal to keep the voltage in third node at the first power voltage, with the capacitor maintaining a voltage difference between the second node and the third node;
    wherein the first transistor supplies the first power voltage to the output terminal when the first transistor is in the on-state, the second transistor supplies the first power voltage to the first node when the second transistor is in the on-state, and the pull-up drive unit turns off the pull-up unit according to the first power voltage of the first node.

2. The shift register as claimed in claim 1, wherein the $Q_{th}$ unit stage disables the $Q_{th}$ output signal according to a $(Q+1)_{th}$ output signal of a $(Q+1)_{th}$ unit stage.

3. The shift register as claimed in claim 2, wherein the second pull-down unit further comprises a third transistor, the drain of the third transistor being connected to the first node, its gate receiving the $(Q+1)_{th}$ output signal of the $(Q+1)_{th}$ unit stage, and its source being connected to the first power voltage source, and the third transistor turned on by the $(Q+1)_{th}$ output signal supplying the first power voltage to the first node so as to turn off the pull-up unit.

4. The shift register as claimed in claim 1, wherein each unit stage further comprises a floating preventing unit connected to the third node for supplying the second power voltage to the third node and preventing the third node from being floated.

5. The shift register as claimed in claim 4, wherein each unit stage further comprises a turn-on preventing unit connected to the third node for determining whether to provide the first power voltage to the third node according to the voltage level of the first node.

6. The shift register as claimed in claim 1, wherein each odd-numbered clock signal has a phase opposite to that of the even-numbered clock signal.

7. The shift register as claimed in claim 1, wherein the first, second and third odd-numbered control signals have a phase difference of one duty period relative to the first, second and third even-numbered control signals, respectively.

8. The shift register as claimed in claim 7, wherein each two consecutive odd-numbered control signals have a phase difference of one duty period, and each two consecutive even-numbered control signals have a phase difference of one duty period.

9. The shift register as claimed in claim 1, wherein the first, second and third odd-numbered control signals received by a $j_{th}$ unit stage (j is an odd number; j>4) are an output signal of a $(j-4)_{th}$ unit stage, an output signal of a $(j-3)_{th}$ unit stage, and an output signal of a $(j-2)_{th}$ unit stage, respectively.

10. The shift register as claimed in claim 1, wherein the first, second and third even-numbered control signals received by a $k_{th}$ unit stage (k is an odd number; k>3) are an output signal of a $(k-3)_{th}$ unit stage, an output signal of a $(k-2)_{th}$ unit stage, and an output signal of a $(k-1)_{th}$ unit stage, respectively.

11. A unit stage of a shift register for receiving a clock signal, a first control signal, a second control signal, a third control signal, a feedback control signal, and an input signal as drive signals to generate an output signal, the unit stage comprising:
  a pull-up unit comprising a first node for receiving the clock signal;
  a pull-up drive unit connected to the first node for driving the pull-up unit according to the input signal so as to supply the clock signal to an output terminal to generate the output signal;
  a first pull-down unit comprising a first transistor, the drain of the first transistor being connected to the output terminal, its source being connected to a first power voltage source having a first power voltage, and its gate being connected to a second node;
  a second pull-down unit, comprising:
    a second transistor, the drain of the second transistor being connected to the first node, its gate being connected to the second node, and its source being connected to the first power voltage source; and
    a third transistor, the drain of the third transistor being connected to the first node, its gate receiving the feedback control signal, and its source being connected to the first power voltage source; and
  a pull-down memory control unit comprising a capacitor whose two ends are respectively connected to the second node and the third node, the pull-down memory control unit receiving the first control signal to increase the voltage of the second node to a second power voltage so as to turn on the first and the second transistors and to decrease the voltage of the third node to the first power voltage, and receiving the second control signal to keep the voltage of the third node at the first power voltage, with the capacitor maintaining a voltage difference between the second node and the third node;
  wherein the first transistor supplies the first power voltage to the output terminal when the first transistor is in the on-state, the second transistor supplies the first power voltage to the first node when the second transistor is in the on-state, the third transistor supplies the first power voltage to the first node when the third transistor is turned on by the feedback control signal, and the pull-up drive unit turns off the pull-up unit according to the first power voltage of the first node.

12. The unit stage as claimed in claim 11, further comprising a floating preventing unit connected to the third node for supplying the second power voltage to the third node and preventing the third node from being floated.

13. The unit stage as claimed in claim 12, further comprising a turn-on preventing unit connected to the third node for determining whether to provide the first power voltage to the third node according to the voltage level of the first node.

14. The unit stage as claimed in claim 11, wherein the first, second and third control signals of a current unit stage are output signals of preceding unit stages.

15. The unit stage as claimed in claim 11, wherein the input signal of a current unit stage is an output signal of a preceding unit stage, and the feedback control signal of a current unit stage is an output signal of a succeeding unit stage.

16. A unit stage of a shift register, comprising:
  a pull-up unit comprising a first node for receiving a clock signal;
  a pull-up drive unit connected to the first node for driving the pull-up unit according to an input signal so as to supply the clock signal to an output terminal to generate an output signal;
  a first pull-down unit comprising a first transistor, the drain of the first transistor being connected to the output terminal, its source being connected to a first power voltage source having a first power voltage, and its gate being connected to a second node;
  a second pull-down unit comprising a second transistor, the drain of the second transistor being connected to the first node, its gate being connected to the second node, and its source being connected to the first power voltage source; and
  a pull-down memory control unit comprising a capacitor whose two ends are respectively connected to the second node and a third node, the pull-down memory control unit receiving a first control signal to increase the voltage of the second node to a second power voltage of a second power voltage source so as to turn on the first and the second transistors and to decrease the voltage of the third node to the first power voltage, and receiving a second control signal to keep the voltage of the third node at the first power voltage, with the capacitor maintaining a voltage difference between the threshold voltage of the first transistor and the threshold voltage of the second transistor;
  wherein the first transistor supplies the first power voltage to the output terminal when the first transistor is in the on-state, the second transistor supplies the first power voltage to the first node when the second transistor is in the on-state, and the pull-up drive unit turns off the pull-up unit according to the first power voltage of the first node.

17. The unit stage as claimed in claim 16, wherein the second pull-down unit further comprises a third transistor, the drain of the third transistor being connected to the first node, its gate receiving a feedback control signal, and its source being connected to the first power voltage source, and the third transistor supplies the first power voltage to the first node when the third transistor is turned on by the feedback control signal, with the pull-up drive unit turning off the pull-up unit according to the first power voltage of the first node.

18. The unit stage as claimed in claim 16, wherein the pull-down memory control unit further comprises:
- a fourth transistor, its drain being connected to the third node, its gate receiving the first control signal, and its source being connected to the first power voltage source;
- a fifth transistor, its drain being connected to the second power voltage source, its gate being connected to the first control signal, and its source being connected to the second node;
- a sixth transistor, its drain being connected to the third node, its gate receiving the second control signal, and its source being connected to the first power voltage source, and
- a seventh transistor, its drain being connected to first node, its gate receiving the second control signal, and its source being connected to the second node.

19. The unit stage as claimed in claim 16, further comprising a floating preventing unit connected to the third node for supplying the second power voltage to the third node and preventing the third node from being floated.

20. The unit stage as claimed in claim 19, further comprising a turn-on preventing unit connected to the third node for determining whether to provide the first power voltage to the third node according to the voltage level of the first node.

21. The unit stage as claimed in claim 16, wherein the first and second control signals of a current unit stage are output signals of preceding unit stages.

22. The unit stage as claimed in claim 16, wherein the input signal of a current unit stage is an output signal of a preceding unit stage, and the feedback control signal of a current unit stage is an output signal of a succeeding unit stage.

23. The unit stage as claimed in claim 16, wherein the second pull-down unit further comprises a tenth transistor, the drain of the tenth transistor being connected to the first node, its gate receiving a third control signal, and its source being connected to the first power voltage source.

24. The unit stage as claimed in claim 23, wherein the third control signal of a current unit stage is an output signal of a preceding unit stage.

* * * * *